United States Patent
Hueting et al.

(10) Patent No.: US 7,109,567 B2
(45) Date of Patent: Sep. 19, 2006

(54) SEMICONDUCTOR DEVICE AND METHOD OF MANUFACTURING SUCH DEVICE

(75) Inventors: Raymond Josephus Engelbart Hueting, Eindhoven (NL); Jan Willem Slotboom, Eindhoven (NL); Leon Cornelis Maria Van Den Oever, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/495,943

(22) PCT Filed: Nov. 21, 2002

(86) PCT No.: PCT/IB02/04852

§ 371 (c)(1),
(2), (4) Date: May 18, 2004

(87) PCT Pub. No.: WO03/044861

PCT Pub. Date: May 30, 2003

(65) Prior Publication Data

US 2005/0001288 A1    Jan. 6, 2005

(30) Foreign Application Priority Data

Nov. 21, 2001    (EP) .................................. 01204441

(51) Int. Cl.
*H01L 27/082* (2006.01)
*H01L 21/8238* (2006.01)

(52) U.S. Cl. ...................... 257/565; 257/575; 257/578; 257/197; 257/200; 257/201; 257/574; 257/576; 257/196; 257/198; 438/205; 438/313; 438/340

(58) Field of Classification Search ................ 257/192, 257/198, 582, 559, 586, 199, 592, 197, 372, 257/370, 378; 357/34, 27
See application file for complete search history.

(56) References Cited

U.S. PATENT DOCUMENTS

| | | | | | |
|---|---|---|---|---|---|
| 4,771,326 | A | * | 9/1988 | Curran | ........................ 257/18 |
| 4,903,090 | A | * | 2/1990 | Yokoyama | .................. 257/198 |
| 5,198,689 | A | | 3/1993 | Fujioka | |
| 5,369,291 | A | * | 11/1994 | Swanson | ..................... 257/130 |
| 5,668,022 | A | | 9/1997 | Cho | |

FOREIGN PATENT DOCUMENTS

| JP | 01 101665 | 4/1989 |
|---|---|---|
| JP | 08 107116 | 4/1996 |

* cited by examiner

*Primary Examiner*—Nathan J. Flynn
*Assistant Examiner*—Fazli Erdem
(74) *Attorney, Agent, or Firm*—Aaron Waxler

(57) ABSTRACT

The invention relates to a semiconductor device with a heterojunction bipolar, in particular npn, transistor with an emitter region (1), a base region (2), and a collector region (3), which are provided with respectively a first, a second, and a third connection conductor (4, 5, 6), while the bandgap of the base region (2) is lower than that of the collector region (3) or of the emitter region (1), for example owing to the use of a silicon-germanium alloy instead of pure silicon. Such a device is very fast, but its transistor shows a relatively low BVceo. In a device according to the invention, the emitter region (1) or the base region (2) comprises a sub-region (1B, 2B) with a reduced doping concentration, which sub-region (1B, 2B) is provided with a further connection conductor (4B, 5B) which forms a Schottky junction with the sub-region (1B, 2B). Such a device results in a transistor with a particularly high cut-off frequency fT but with no or hardly any reduction of the BVceo. In a preferred embodiment, the emitter region (1) and its sub-region (1B), or the base region (2) and its sub-region (2B) both border the surface of the semiconductor body (10) and the further connection conductor (4B, 5B) forms part of the first or the second connection conductor (4, 5), as applicable. The invention also comprises a method of manufacturing a device according to the invention.

12 Claims, 3 Drawing Sheets

SEMICONDUCTOR DEVICE AND METHOD OF MANUFACTURING SUCH DEVICE

Figure 1:
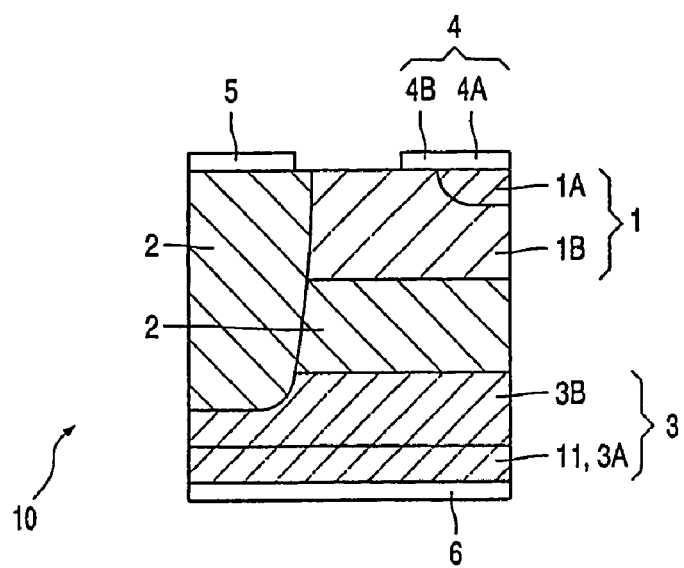

The invention relates to a semiconductor device comprising a semiconductor body with a substrate and a semiconductor layer structure of silicon, which structure comprises a bipolar transistor having an emitter region of a first conductivity type, a base region of a second conductivity type opposed to the first conductivity type, and a collector region of the first conductivity type having a first, a second and a third doping concentration, respectively, and having a first, a second, and a third connection conductor, respectively, the base region comprising a semiconductor material whose bandgap is lower than that of the material of the collector region or of the emitter region. The invention also relates to a method of manufacturing such device.

Such device and method are known from United States patent U.S. Pat. No. 5,198,869, published on Mar. 30, 1993. It shows a semiconductor device with a bipolar transistor having a heterojunction close to the interface between the base region and the collector region and close to the interface between the base region and the emitter region, which interface is formed by growing the base region from a silicon-germanium mixed crystal. Such a transistor has highly advantageous high-frequency properties shown, inter alia, in a high cut-off frequency $f_T$.

A disadvantage of the known transistor is, more particularly when the base region has a relatively high germanium content, that it has a relatively low breakdown voltage from the emitter to the collector, the so-called $BV_{ceo}$ which is highly undesired.

Therefore, it is an object of the invention to provide a semiconductor device with a bipolar transistor that does not have said disadvantage and has an acceptable emitter-collector breakdown voltage despite the presence of germanium in the base region.

To this end, according to the invention, a semiconductor device of the type defined in the introduction is characterized in that the emitter region or the base region comprises a sub-region that has a lower doping concentration, the sub-region having a further connection conductor which together with the sub-region forms a Schottky junction. The invention is based on the recognition that the reduction of the $BV_{ceo}$ in the known device is caused by the relatively low base current of the transistor, which entails a relatively high power gain of such a transistor. After all, the collector current of such a transistor is relatively high, which is desired for a very fast transistor with a high $f_T$. The invention is further based on the recognition that an increase of the base current is made possible by an increase of the current of minority charge carriers at the emitter contact, i.e. the holes in an npn transistor, or by an increase of the current of minority charge carriers at the base contact, i.e. the electrons in an npn transistor. To this end according to the invention, the use of a further connection conductor which forms a Schottky junction with either a lower-doped part of the emitter region or a lower-doped part of the base region is a very suitable means.

As regards a Schottky junction parallel with the customary emitter connection it holds that this Schottky junction yields an increase of the current of the minority charge carriers, for example holes in an npn transistor, which causes the base current to rise and thus the power gain to drop. Although this increase of the current would increase the emitter resistance in general, this disadvantage is taken away easily by the provision of a high doped part of the emitter region. Thanks to the presence of a normal, i.e. ohmic, contact between the first connection conductor and the high-doped part of the emitter region, it is there that the current of majority charge carriers flows, in this case electrons, and the emitter resistance may yet be extremely low.

As regards a Schottky junction parallel with the customary base connection, it holds that this Schottky junction increases the current of the minority charge carriers in the base region, in this case electrons, in the base emitter diode and thus also reduces the gain. A semiconductor device according to the invention therefore comprises a bipolar heterojunction transistor which has excellent high-frequency properties such as a very high cut-off frequency also thanks to a very high collector current, but which does not or not substantially suffer from a reduction of the breakdown voltage between emitter and collector, the so-called common emitter breakdown voltage $BV_{ceo}$, in which the word 'common' refers to the fact that during the measuring operation the emitter is connected to a common connection, usually ground, and the 'o' in 'ceo' refers to the fact that an open base connection is used during the measuring operation. By applying a voltage to the further contact hole, the desired gain reduction may be set such that there is no or at least substantially no reduction of $BV_{ceo}$ compared with a transistor of which the bandgap of the material of the base region is not reduced.

In a preferred embodiment of a semiconductor device according to the invention, the emitter region and its sub-region or the base region and its sub-region both adjoin the surface of the semiconductor body and the further connection conductor hole forms part of the first or the second connection conductor, as applicable. This achieves that the device according to the invention has no more than three connection conductors. Furthermore, such a construction according to the invention can be manufactured in a simple manner from a technological point of view and is substantially not in the way of the compactness of the transistor. The fact that the emitter region and its sub-region or the base region and its sub-region adjoin the surface of the semiconductor body highly facilitates this, particularly if the surface of the semiconductor body is flat or substantially flat. An important recognition that further plays a role in this preferred embodiment is the recognition that the wanted gain reduction can be easily adjusted in a manner other than by applying a voltage to the further connection conductor. Choosing a suitable ratio of the emitter region or base region surface to the sub-region surface thereof may also achieve the desired result. Said ratio may be in fact chosen at will within certain limits.

In a highly advantageous embodiment, the base region has a weakly-doped sub-region. As regards its manufacture, this embodiment is more in keeping with the manufacture of more conventional transistors. Besides, in this modification the current characteristic can possess a more ideal shape. In a further advantageous modification the emitter region further has a region of a semiconductor material that has a reduced bandgap. This is also the cause of less gain than if the emitter region should contain, for example, monocrystalline silicon and the base region a mixed silicon-germanium alloy. For the emitter region, too, germanium may be added to the silicon to reduce the bandgap. A suitable germanium content is between 10 and 30 at % for the base region and is preferably 20 at %.

The thickness of the portion of the base region containing germanium is preferably between 20 and 30 nm. In the case where (also) the emitter region contains a germanium-silicon alloy, there is preferably an approximately 15 nm thick silicon region around the interface to the base region in the emitter region. As a result, it is avoided that the heterojunction coincides with the respective pn junction, which is desired so as to avoid defects at or close to the pn junction. Besides, a pn junction within a silicon region has the advantage of a relatively low emitter-base capacity, and thus of a relatively high fT, i.e. switching frequency. In this way it is also easier to keep the overall thickness of the germanium-containing regions below this value—when the germanium content is about 20 at %—where (misfit) dislocations can no longer be prevented from arising, i.e. a thickness of about 30 nm.

The substrate comprises silicon by preference, but may alternatively be silicon-on-insulator substrate, or an insulating substrate that, has been provided with a substrate transfer technique.

The semiconductor device according to the invention preferably includes a npn transistor. It is found that such a transistor has the technological advantage that the germanium present in the base region and the doping element boron customary for the p-conductivity type can be present here side by side without detrimental effects.

A method of manufacturing a semiconductor device comprising a semiconductor body of silicon with a substrate and a semiconductor layer structure comprising silicon, which structure comprises a bipolar transistor with an emitter region of a first conductivity type, a base region of a second conductivity type opposed to the first conductivity type, and a collector region of the first conductivity type having a first, a second and a third doping concentration, respectively, which are provided with a first, a second and a third connection conductor, respectively, the base region being provided with a semiconductor material whose bandgap is lower than that of the material of the collector region or the emitter region, characterized according to the invention in that the emitter region or the base region is formed such that it includes a sub-region that has a lower doping concentration, the sub-region being provided with a further connection conductor which forms a Schottky junction with the sub-region. A device according to the invention may be easily obtained by such a method.

In a preferred embodiment of a method according to the invention the emitter region and its sub-region or the base region and its sub-region are both formed so as to adjoin the surface of the semiconductor body, and the further connection conductor is formed as part of the first or second connection conductor, respectively. Thus a simple and compact device according to the invention is obtained. The emitter region is preferably formed by the growing of a doped region in which a higher-doped region is grown locally, the sub-region of the emitter region being formed by the portion of the doped region located outside the higher-doped region. In a highly attractive modification, the higher-doped region of the emitter region is grown by the use of a hole having spacers in an insulation layer deposited on the semiconductor body, and the spacers are removed prior to a metal layer being deposited in the hole, as a result of which, the first connection conductor is formed in the high-doped region of the emitter region, thus constituting an ohmic contact with the emitter region, and outside said region the further connection conductor is formed which constitutes the Schottky junction with to the emitter region.

Figure 2:
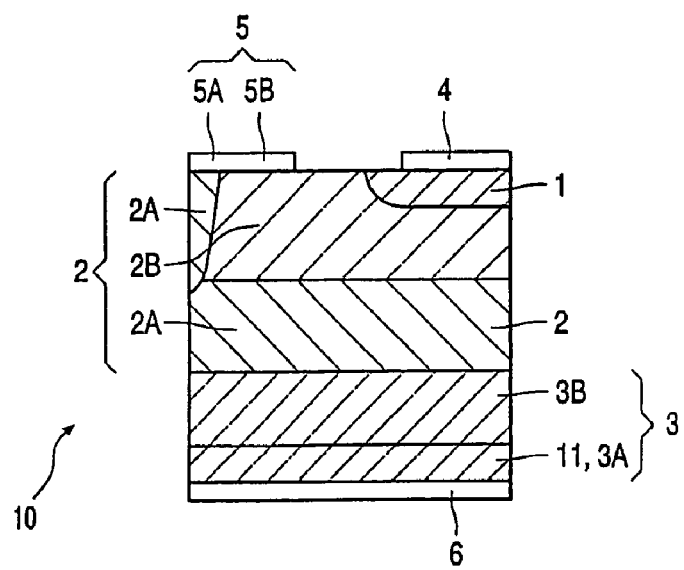
Figure 3:
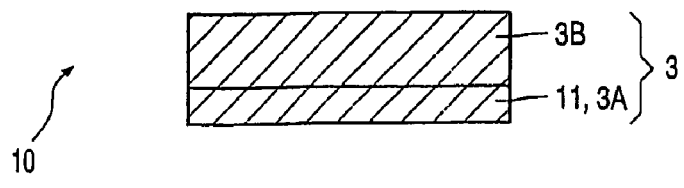

Further aspects, effects and details of the invention will be described below with reference to embodiments illustrated in the drawings, in which FIG. 1 diagrammatically and in a cross-section perpendicular to the direction of thickness shows a first embodiment of a semiconductor device according to the invention;

FIG. 2 diagrammatically and in a cross-section perpendicular to the direction of thickness shows a second embodiment of a semiconductor device according to the invention;

FIGS. 3 to 11 diagrammatically and in cross-sections perpendicular to the direction of thickness show an advantageous modification of the device shown in FIG. 1 in successive stages of manufacture by a method according to the invention.

The Figures are not drawn to scale and some dimensions are shown in exaggerated form for the sake of clarity. Like regions or elements have like reference symbols as much as possible.

FIG. 1 diagrammatically and in a cross-section perpendicular to the direction of thickness shows a first embodiment of a semiconductor device according to the invention. The device of this example comprises a semiconductor body 10 with a substrate 11 and a semiconductor layer structure deposited thereon and a bipolar transistor. The transistor, discrete in this example, has an n-type emitter region 1, a p-type base region 2, and an n-type collector region 3 which have a first, a second, and a third connection conductor (4,5,6), respectively. The base region 2 comprises a silicon-germanium alloy with a germanium content of 20 at %, while the collector 3 and the emitter 1 comprise silicon. The substrate 11 here forms a strongly-doped portion 3A of the collector region 3, which also has a weakly doped, so-called drift region 3B. The base region 2 comprises two strongly-doped parts 2, one of them bordering the surface of the semiconductor body 10 and one being located under the emitter region 1. The contact holes 5, 6 of the base region 2 and the collector region 3 comprise contain aluminum.

According to the invention the—in this example—emitter region 1 comprises a strongly doped sub-region 1A and a weakly-doped sub-region 1B, here having respective doping concentrations of approximately $10^{20}$ at/cm$^3$ and $10^{18}$ at/cm$^3$. The strongly doped portion 1A and the sub-region 1B each have a portion 4A and 4B, respectively, of a single connection conductor 4 in this example, which portions 4A, 4B form an ohmic contact with the strongly-doped sub-region 1A of the emitter region 1 and a Schottky junction with the weakly doped sub-region 1B of the emitter region 1, respectively. The Schottky junction parallel to the portion 4A of the emitter region 1A provides an acceleration of the minority charge carriers, holes in the npn transistor of this example, which reduces the base current $I_B$ and thus the power gain. However, this also causes the emitter resistance to increase, which is undesired. Thanks to the presence of a normal, i.e. ohmic contact between the first connection conductor 4A and the strongly-doped portion 1A of the emitter region 1, the current of majority charge carriers, i.e. electrons, is flowing there, and the emitter resistance may still be extremely low. Thanks to the reduction of the gain g, the bipolar heterojunction transistor of the device of this example, nevertheless, i.e. despite a very high collector current, possesses a high cut-off frequency $f_T$ and, on the other hand, an unreduced or substantially unreduced $BV_{ceo}$.

The desired gain reduction in this example is set by a suitable choice of the ratio of the surfaces of the sub-regions 4A, 4B from which the connection conductory is formed. In this example the ratio is 10. This means that the surface of the connection conductor 4A to the strongly-doped region 1A is ten times as large as the surface of the connection conductor 4B to the low-doped region 1B, the interface of which conductor and region (4B, 1B) forms the Schottky junction. The emitter region 1 is here 0.8×10 µm$^2$ and the thickness is 60 nm. The strongly-doped portion 1A is 30 nm thick. By not providing the Schottky junction with a separate connection conductor 4B, but with a connection conductor 4 common to the strongly-doped portion 1A of the emitter 1, the device of this example can be manufactured in a relatively simple and extremely compact manner, which also adds to the excellent high-frequency properties. The dimensions of the whole device are here about 2×10 μm$^2$ and its thickness is about 600 μm. The connection conductor 5, 6, 4 of base 2, collector 3, and emitter 1 are made of aluminum here. The collector region 3 comprises not only the substrate region 3A but also an epitaxial, weakly-doped drift region 3B. The base region 2 comprises a portion adjoining the surface of the semiconductor body 10, to which portion the connection conductor 5 is connected.

FIG. 2 diagrammatically and in a cross-section perpendicular to the direction of thickness shows a second embodiment of a semiconductor device according to the invention. The device of this example is largely identical to that of the first example. The main differences relate to the n-type emitter region 1 and the p-type base region 2: the emitter region 1 here comprises exclusively a strongly-doped portion 1 with which the first connection conductor hole 4 makes an ohmic contact. The base region 2 here comprises a strongly-doped portion 2A which borders the collector region 3 and locally extends to the surface of the semiconductor body 10, and a weakly-doped portion 2B bordering the emitter region 1 and the surface of the semiconductor body 10. The connection conductor 5 here forms a connection conductor 5A which forms an ohmic contact with, the strongly-doped portion 2A of the base region and a connection conductor 5B which forms a Schottky junction with the more weakly doped portion 2B of the base region 2. In the device of this example, the Schottky junction parallel to the normal base region 4A provides that the current of minority charge carriers, i.e. electrons, in the base-emitter diode is increased, so that the gain is reduced despite a high collector current. This device according to the invention also comprises a bipolar heterojunction transistor which has excellent high-frequency properties such as a very high cut-off frequency but which does not suffer at all or does not substantially suffer from a reduction of the breakdown voltage between emitter and collector, the so-called common emitter breakdown voltage $BV_{ceo}$.

FIGS. 3 to 11 diagrammatically and in cross sections perpendicular to the direction of thickness show an advantageous variant of the device shown in FIG. 1 in successive stages of manufacture via a method according to the invention. The main difference with the device of FIG. 1 relates to the presence of so-called STI (Shallow Trench Insulation) regions 20 (see for example FIG. 11) which adjoin the collector drift region 3B on both sides and which contribute to a very low collector-base capacitance, thus enhancing the speed of the device. The remaining differences shown in the drawing mainly relate to the manufacture of the device, which will be discussed below for the device of FIG. 11.

An n-type silicon substrate 11 is started from (see FIG. 3), which forms a strongly doped part 3A of the collector region 3 of the transistor of the device of this modification. A layer 3B having a thickness of 0.5 μm and a doping concentration of about $10^{17}$ at/cm$^3$ is then deposited on this substrate and forms a drift region 3B of the collector region 3.

Figure 4:
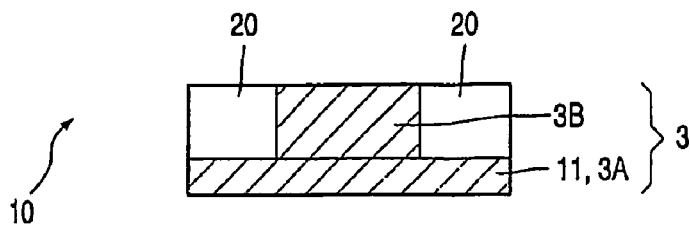
Figure 5:
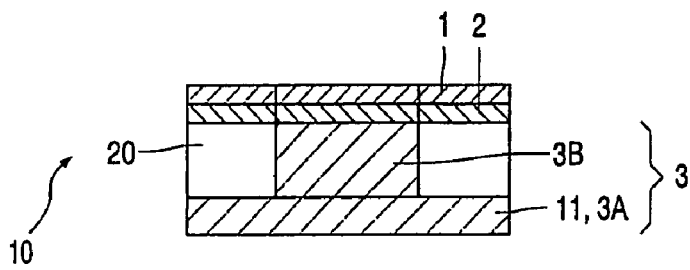
Figure 6:
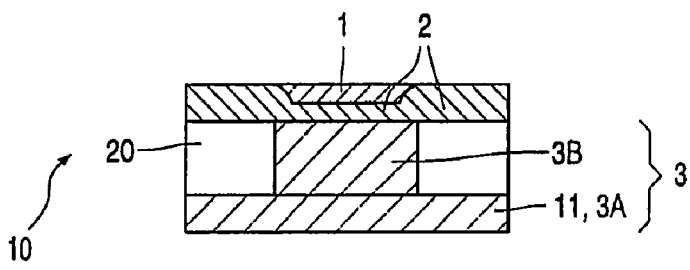
Figure 7:
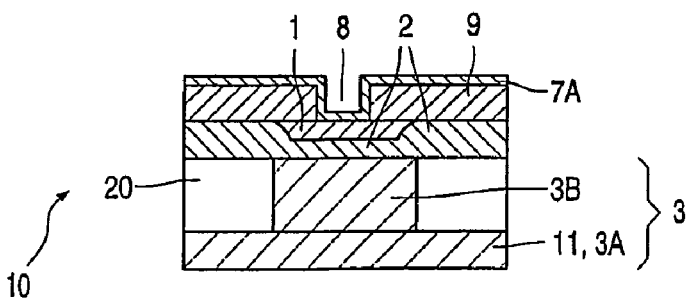
Figure 8:
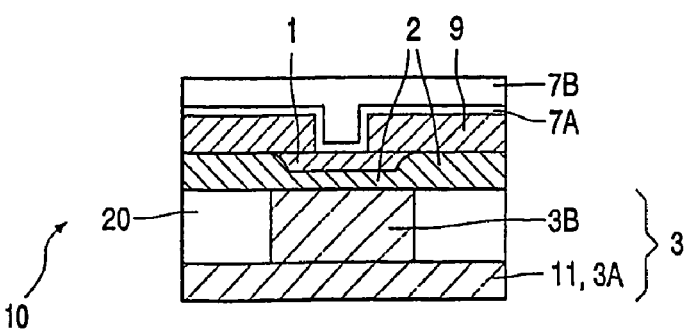
Figure 9:
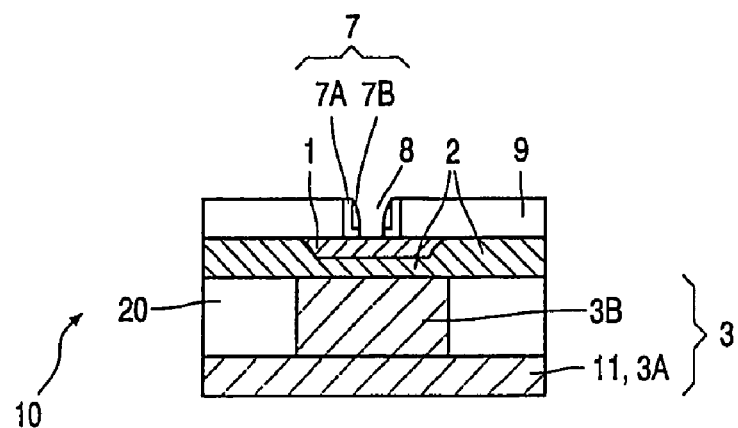
Figure 10:
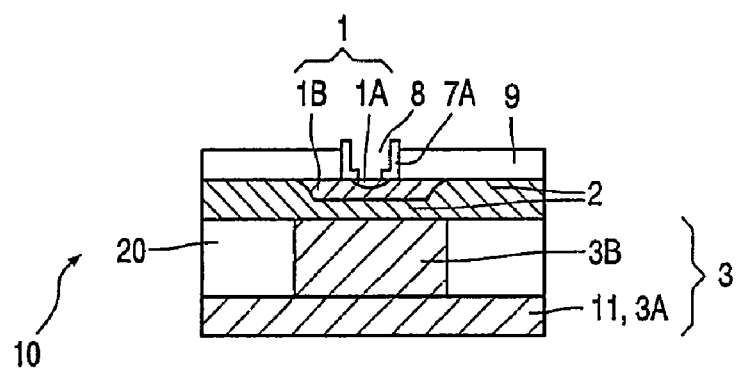
Figure 11:
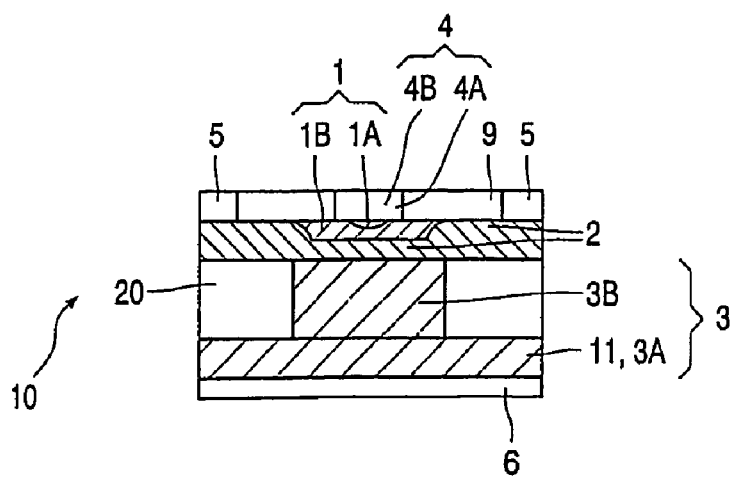

Subsequently, trenches 20 are etched in the semiconductor body 10 (see FIG. 4). An oxide layer (not shown in the drawing) is then deposited on the semiconductor body with the aid of TEOS (Tetra Ethyl Ortho Silicate), with which the trenches 20 are filled. The parts of the oxide layer located outside (and above) the trenches 20 are removed by CMP (Chemical Mechanical Polishing).

Then (see FIG. 5) a p-type silicon layer 2 is epitaxially deposited, to which 20 at % germanium is added, which layer is 25 nm thick and has a doping concentration of $2*10^{19}$ at/cm$^3$, and on top of this an n-type silicon layer 1 which is 60 nm thick and has a doping concentration of about $10^{18}$ at/cm$^3$. The portions of these layers 1, 2 located above the insulation regions 20 are polycrystalline, the layers located in between are monocrystalline.

Then (see FIG. 6) a mask—not shown in the drawing—a mask is used for carrying out a boron ion implantation, whereby the portions of the layers 1,2 located above the regions 20 are heavily p-type doped, so that they can act as connection regions for the base region 2.

Then (see FIG. 7) a 500 nm-thick insulation oxide layer 9 is deposited on the surface of the semiconductor body 10 by CVD (Chemical Vapor Deposition). A hole 8 is provided therein, whereupon a 15 nm thick silicon nitride layer 7A is applied by CVD. Then (see FIG. 8) a 750 nm thick insulating silicon dioxide layer 7B is deposited by CVD, so that the hole 8 is filled up completely, or (alternatively) partially.

Then (see FIG. 9) the insulation layer 7B is largely removed again by plasma etching, forming the hole 8 again in the insulation layer 9 but now provided with spacers 7. During this etching process portions of the nitride layer 7A which are located outside and inside the hole 8 act as an etch stop layer, which parts are again removed by selective etching—after removal of the insulation layer 7B. Subsequently, (see FIG. 10) the portions 7B of the spacers 7 are removed by (selective) etching, whereby the thickness of the insulation layer 9 is also reduced. Then the strongly-doped portion 1A of the emitter region 1 is formed, for example by an As ion implantation, the remaining portions 7A of the spacers 7 functioning as a mask.

Then (see FIG. 11) the spacers 7 are removed completely by selective etching of the portions 7A thereof. A thermal step is then executed at about 1000° C. and for the duration of 10 seconds, during which the doping atoms of the region 1A, 2A of the emitter 1 and of the base region 2 are activated. Then a metal layer of aluminum is deposited on both sides of the semiconductor body, which layer forms a connection conductor 6 for the collector region 3 on the lower side of the substrate 11 and from which layer the connection conductor 4, 5 are formed for the emitter region 1 and the base region 2, respectively, on top of the semiconductor body 10. Then the device of this example is ready for final mounting and ready for use.

The invention is not restricted to the examples given, because within the scope of the invention a plurality of variations and modifications are possible for a man of ordinary skill in the art. For example, the invention may be implemented not only in a discrete semiconductor device, but equally well in an integrated semiconductor device such as a BICMOS (Bipolar Complementary Metal Oxide Semiconductor) IC (Integrated Circuit). The inventive measures may be distributed not only in a single component—discrete or not—but also over two separate components. In that case, for example, a separate (for example discrete) Schottky diode is present or mounted beside a (for example discrete) heterojunction (npn) bipolar transistor with a base region comprising germanium. The effect of the invention is then generated by making electrical connections between the separate components in a manner similar to the example given above. If the two separate components are discrete components, the electrical connections may be formed, for example, by conducting wires.

Furthermore it is observed that in lieu of STI insulation regions, it is alternatively possible for insulation regions to be obtained through LOCOS (Local Oxidation Of Silicon) technology. The structure of a device according to the invention may comprise in addition to a substantially completely planar surface also one or more mesa-like parts. Another modification is obtained by achieving the desired variation of the bandgap in the emitter, base, and collector not by reducing the bandgap of the base region relative to the collector region (or the emitter region), but by actually increasing the bandgap of the latter region or regions. The collector region (and the emitter region) may then comprise, for example, silicon carbide, with the base region comprising silicon. Also the use of polycrystalline silicon—which has a lower bandgap than monocrystalline silicon—side by side with the use of monocrystalline silicon offers a comparable possibility. This means that the invention can be applied with all combinations of a material with a Small bandgap in the base (B), and a material with a large bandgap in the collector (C), and/or a material with a large bandgap in the emitter, (E) i.e. for E/B/C/Si/SiGe/Si or SiGe/SiGe/Si or Si/Si/SiC or SiC/Si/SiC, etc.

It also holds for a method according to the invention that variations and modifications are possible. For example, the strongly-doped portion of the emitter region may alternatively be formed by a diffusion from a strongly-doped polycrystalline silicon layer or by diffusion from a so-called PSG (Phosphor Silicate Glass) layer. In the former case the layer then used may also function as a connection conductor of the emitter region, more particularly when, after diffusion, the layer is converted in whole or in part into a silicide. The base region may furthermore be formed by a BSG (Boron Silicate Glass) layer or by VPD (Vapor Phase Doping).

The invention claimed is:

1. A semiconductor device comprising a semiconductor body (10) of silicon with a substrate (11) and a semiconductor layer structure of silicon, which structure comprises a bipolar transistor having an emitter region (1) of a first conductivity type, a base region (2) of a second conductivity type opposed to the first conductivity type and with a germanium content between 10 and 30 at %, and a collector region (3) of the first conductivity type having a first, a second, and a third doping concentration, respectively, and having a first, a second, and a third connection conductor (4, 5, 6), respectively, the base region (2) comprising a semiconductor material whose bandgap is lower than that of the material of the collector region (3) or of the emitter region (1), wherein the emitter region (1) or the base region (2) comprises a strongly doped portion and a sub-region (1B, 2B) that has a lower doping concentration, the sub-region (1B, 2B) having a further connection conductor (4B, 5B) which together with the sub-region (1B, 2B) forms a Schottky junction and the strongly doped portion forms an ohmic contact with the first or second connection conductor.

2. A semiconductor device as claimed in claim 1, characterized in that the emitter region (1) and its sub-region (1B) or the base region (2) and its sub-region (2B) both adjoin the surface of the semiconductor body (10), and the further connection conductor (4B, 5B) forms part of the first or the second connection conductor (4, 5), as applicable.

3. A semiconductor device as claimed in claim 1, characterized in that the sub-region (1B) forms part of the base region (2).

4. A semiconductor device as claimed in claim 1, characterized in that the emitter region (1) also comprises a region of a semiconductor material having a reduced bandgap.

5. A semiconductor device as claimed in claim 1, characterized in that the bandgap of the base region (2) and, if so desired, the bandgap of the semiconductor material of part of the emitter region (1) is reduced by the addition of germanium to silicon.

6. A semiconductor device as claimed in any claim 1 characterized in that the germanium content of the base region is 20 at %.

7. A semiconductor device as claimed in claim 1, characterized in that the ratio of surfaces areas of the connection conductors (4;4B) to emitter region (1) and its sub-region (1B) or of the connection conductors (5,5B) to base region (2) and its sub-region (2B) is chosen such that the breakdown voltage between the emitter region and the collector region ($BV_{ceo}$) is not substantially reduced, as compared with a device comprising a transistor whose base region (2) does not comprise material with a reduced band gap.

8. A semiconductor device as claimed in claim 1, characterized in that the first conductivity type is the n-conductivity type.

9. A method of manufacturing a semiconductor device comprising a semiconductor body (10) of silicon with a substrate (11) and a semiconductor layer structure of silicon, which structure comprises a bipolar transistor having an emitter region (1) of a first conductivity type, a base region (2) of a second conductivity type opposed to the first conductivity type and with a germanium content between 10 and 30 at %, and a collector region (3) of the first conductivity type having a first, a second and a third doping concentration respectively, and having have a first, a second and a third connection conductor (4, 5, 6), respectively, the base region (2) comprising a semiconductor material whose bandgap is lower than that of the material of the collector region (3) or of the emitter region (1), wherein the emitter region (1) or the base region (2) comprises a strongly doped portion and a sub-region (1B, 2B) that has a lower doping concentration, the sub-region (1B, 2B) having a further connection conductor (4B, 5B) which together with the sub-region (1B, 2B) forms a Schottky junction and the strongly doped portion forms an ohmic contact with the first or second connection conductor.

10. A method as claimed in claim 9, characterized in that the emitter region (1) and its sub-region (1B) or the base region (2) and its sub-region (2B) both adjoin the surface of the semiconductor body (10), and the further connection conductor (4B, 5B) forms pan of the first or the second connection conductor (4, 5), as applicable.

11. A method as claimed in claim 9, characterized in that the emitter region (1) is formed by the formation of a doped region (1) in which locally a more strongly doped portion (1A) is formed, while the portion (1B) of the doped region (1) located outside the more strongly-doped region (1A) forms the sub-region (1B) of the emitter region (1).

12. A method as claimed in claim 11, characterized in that the more strongly-doped portion (1A) of the emitter region (1) is formed by the use of a hole (8) having spacers (7) in an insulation layer (9) deposited on the semiconductor body (10), and the spacers (7) are removed prior to a metallic layer (4) being deposited in the hole (8) as a result of which, in the strongly-doped portion (1A) of the emitter region (1), the first connection conductor (4A) is formed so as to constitute an ohmic contact with the emitter region (1), and the further connection conductor (4B) is formed outside said region so as to constitute the Schottky junction with the emitter region (1).

* * * * *